United States Patent
Guo et al.

(10) Patent No.: US 12,400,953 B2
(45) Date of Patent: Aug. 26, 2025

(54) ELECTRO STATIC DISCHARGE CIRCUIT AND MEMORY

(71) Applicant: CHANGXIN MEMORY TECHNOLOGIES, INC., Hefei (CN)

(72) Inventors: Yingdong Guo, Hefei (CN); Kai Tian, Hefei (CN); Wei Jiang, Hefei (CN); Jing Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 320 days.

(21) Appl. No.: 18/095,400

(22) Filed: Jan. 10, 2023

(65) Prior Publication Data

US 2024/0030130 A1    Jan. 25, 2024

Related U.S. Application Data

(63) Continuation of application No. PCT/CN2022/113549, filed on Aug. 19, 2022.

(30) Foreign Application Priority Data

Jul. 21, 2022  (CN) .......................... 202210869249.0

(51) Int. Cl.
   *H01L 23/525* (2006.01)
   *H01L 23/62* (2006.01)
   *H02H 9/00* (2006.01)

(52) U.S. Cl.
   CPC .......... *H01L 23/5256* (2013.01); *H01L 23/62* (2013.01); *H02H 9/004* (2013.01)

(58) Field of Classification Search
   CPC ..... H01L 23/60; H01L 23/63; H01L 27/0292; H02H 9/046
   USPC .......................................................... 361/56
   See application file for complete search history.

(56) References Cited

U.S. PATENT DOCUMENTS

| 7,072,157 B2 | 7/2006 | Kitagawa |
| 7,660,086 B2 | 2/2010 | Rodgers |
| 8,050,003 B2 | 11/2011 | Kwak |
| 8,344,456 B2 | 1/2013 | Arakawa |

(Continued)

FOREIGN PATENT DOCUMENTS

| CN | 102761115 A | 10/2012 |
| CN | 110957713 A | 4/2020 |

(Continued)

OTHER PUBLICATIONS

International Search Report in the international application No. PCT/CN2022/113549, mailed on Mar. 23, 2023.

*Primary Examiner* — Kevin J Comber

(74) *Attorney, Agent, or Firm* — SYNCODA LLC; Feng Ma

(57) ABSTRACT

Provided are an Electro Static Discharge (ESD) circuit and a memory. The ESD circuit includes: a detection circuit and multiple electrostatic discharge circuits. The detection circuit includes at least one sub-detection circuit connected between a first power end and a second power end. Each sub-detection circuit generates a sub-trigger signal based on a voltage change between the first power end and the second power end. The multiple electrostatic discharge circuits are connected between the first power end and the second power end. The multiple electrostatic discharge circuits are configured to be turned on according to the one or more sub-trigger signals.

14 Claims, 5 Drawing Sheets

(56) References Cited

U.S. PATENT DOCUMENTS

| | | | |
|---|---|---|---|
| 9,537,308 B2* | 1/2017 | Truong | H02H 9/046 |
| 2004/0141269 A1 | 7/2004 | Kitagawa | |
| 2007/0285854 A1* | 12/2007 | Rodgers | H02H 9/046 |
| | | | 361/56 |
| 2008/0247104 A1* | 10/2008 | Kwak | H01L 27/0292 |
| | | | 361/56 |
| 2010/0102392 A1 | 4/2010 | Arakawa | |
| 2014/0022678 A1* | 1/2014 | Maile | H02H 9/046 |
| | | | 361/56 |
| 2016/0322813 A1* | 11/2016 | Aipperspach | H02H 3/20 |
| 2018/0097358 A1* | 4/2018 | Fifield | H01L 27/0285 |
| 2022/0208754 A1 | 6/2022 | Xu | |

FOREIGN PATENT DOCUMENTS

| | | |
|---|---|---|
| CN | 113394762 A | 9/2021 |
| TW | 201244047 A | 11/2012 |
| WO | 2021232212 A1 | 11/2021 |

\* cited by examiner

ELECTRO STATIC DISCHARGE CIRCUIT AND MEMORY

CROSS-REFERENCE TO RELATED APPLICATIONS

The present application is a continuation of International Application No. PCT/CN2022/13549 filed on Aug. 19, 2022, which claims priority to Chinese Patent Application No. 202210869249.0, filed on Jul. 21, 2022. The disclosures of the aforementioned patent applications are hereby incorporated by reference in their entirety.

BACKGROUND

An electro static discharge (ESD) circuit is an important function module in a chip, and is used for discharging electrostatic charges from the outside or inside of the chip to protect other function modules in the chip.

The ESD circuit includes a power clamp circuit for clamping a power supply and a Charged Device Model ESD (CDM ESD) circuit for protecting a data Input/Output (IO) pin. In the chip, the power clamp circuits are positioned at multiple positions of a power line to provide comprehensive electrostatic protection for the power supply. The power clamp circuit usually includes an electrostatic detection circuit for triggering an electrostatic discharge circuit. The electrostatic detection circuit is composed of resistors and capacitors connected in series. In order to deal with the influx of a large amount of charges in a scenario of electrostatic pulse input, both resistance and capacitance are set to be large. As a result, during the layout of circuits, the total layout area for a large number of power clamp circuits occupies a large area of the chip.

It is to be noted that some of the information disclosed in the above background is used only to enhance the understanding of the background of the present, and thus may include information not constituting the conventional art known to those of ordinary skill in the art.

SUMMARY

The present disclosure relates to the field of integrated circuit manufacturing technologies, and in particular to an Electro Static Discharge (ESD) circuit and a memory.

The present disclosure is intended to provide an ESD circuit and a memory to which the ESD circuit is applied for overcoming, at least to a certain extent, a problem that power clamp circuits in the ESD circuit occupy too much layout area.

According to a first aspect of the present disclosure, an ESD circuit is provided, which includes: a detection circuit and multiple electrostatic discharge circuits. The detection circuit includes at least one sub-detection circuit connected between a first power end and a second power end. Each sub-detection circuit is configured to generate a sub-trigger signal based on a voltage change between the first power end and the second power end. The multiple electrostatic discharge circuits are connected between the first power end and the second power end. The multiple electrostatic discharge circuits are configured to be turned on according to one or more sub-trigger signals.

According to a second aspect of the present disclosure, a memory is provided, which includes the above ESD circuit.

It is to be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure. Obviously, the accompanying drawings in the following description are only some embodiments of the present disclosure, for those of ordinary skill in the art, some other accompanying drawings may also be obtained according to these on the premise of not contributing creative effort.

DETAILED DESCRIPTION

Figure 1:
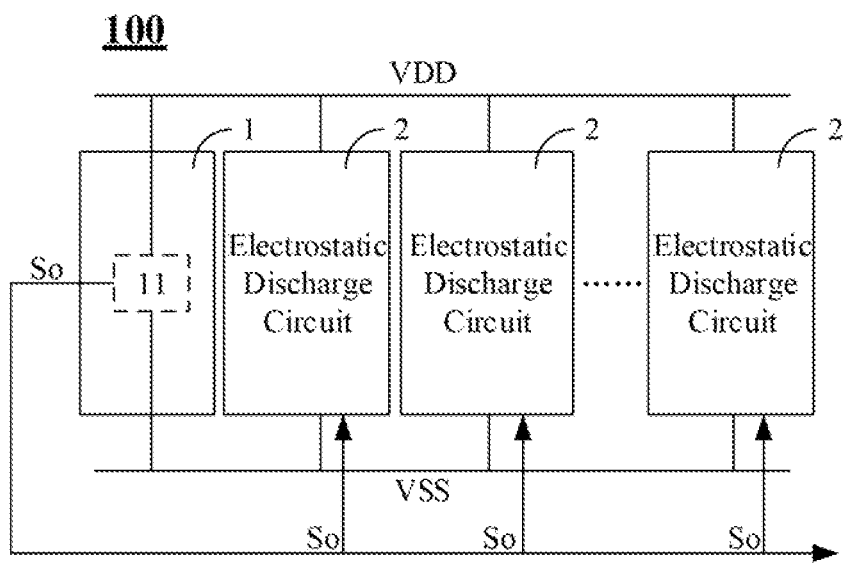
FIG. 1 is a structure diagram of an ESD circuit in an exemplary embodiment of the present disclosure.

Exemplary implementations will be described more comprehensively with reference to the accompanying drawings. However, the exemplary implementations can be implemented in many forms and should not be understood to be limited to the examples described here; on the contrary, providing these implementations makes the present disclosure more comprehensive and complete, and fully communicates the concept of the exemplary implementations to those skilled in the art. The described characteristics, structures, or features can be combined in one or more implementations in any proper way. In the following descriptions, many specific details are provided to give a full understanding of the implementations of the present disclosure. However, those skilled in the art will appreciate that the technical solution of the present disclosure may be practiced while omitting one or more of the specific details, or other methods, components, apparatuses, steps, etc. may be employed. In other cases, the well-known technical solutions are not shown or described in detail, so as to avoid obscuring various aspects of the present disclosure.

In addition, the accompanying drawings are merely schematic illustrations of the present disclosure. The similar reference signs in the drawings denote the same or similar parts, so repeated description thereof will be omitted. Some block diagrams shown in the drawings are functional entities and do not necessarily have to correspond to physically or logically separate entities. These functional entities may be implemented in software, or these functional entities may be implemented in one or more hardware modules or integrated circuits, or these functional entities are implemented in different networks and/or processor apparatuses and/or micro-controller apparatuses.

The exemplary implementations of the present disclosure are elaborated below in combination with the accompanying drawings.

FIG. 1 is a structure diagram of an ESD circuit in an exemplary embodiment of the present disclosure.

Referring to FIG. 1, the ESD circuit 100 may include: a detection circuit 1 and multiple electrostatic discharge circuit 2.

The detection circuit 1 includes at least one sub-detection circuit 11. The sub-detection circuit 11 is connected between a first power end VDD and a second power end VSS. Each sub-detection circuit 11 is configured to generate a sub-trigger signal So based on a voltage change between the first power end VDD and the second power end VSS.

The multiple electrostatic discharge circuits 2 are connected between the first power end VDD and the second power end VSS. The electrostatic discharge circuit 2 is configured to turn on according to one or more sub trigger signals So.

The ESD circuit 100 is a power clamp circuit for clamping power voltages VDD and VSS.

For example, the detection circuit 1 is composed of a resistor and a capacitor, and the electrostatic discharge circuit 2 is composed of one or more transistors. By setting multiple electrostatic discharge circuits 2 to share the detection circuit 1, the disposed capacitors and resistors can be reduced, thus greatly reducing the area occupied by the ESD circuit in the layout of chip.

In other embodiments of the present disclosure, the number of sub-detection circuits 11 is less than the number of electrostatic discharge circuits 2, which can further reduce the disposed capacitors and resistors, so as to reduce the area occupied by the ESD circuit in the layout of chip.

In the embodiment shown in FIG. 1, the detection circuit 1 includes only one sub-detection circuit 11, each of multiple electrostatic discharge circuits 2 is directly connected to the sub-detection circuit 11, and multiple electrostatic discharge circuits 2 are turned on according to the sub-trigger signal So generated by the sub-detection circuit 11. Although FIG. 1 shows only one sub-detection circuit 11, in other embodiments of the present disclosure, the detection circuit 1 may also be composed of multiple sub-detection circuits 11.

Figure 2A:
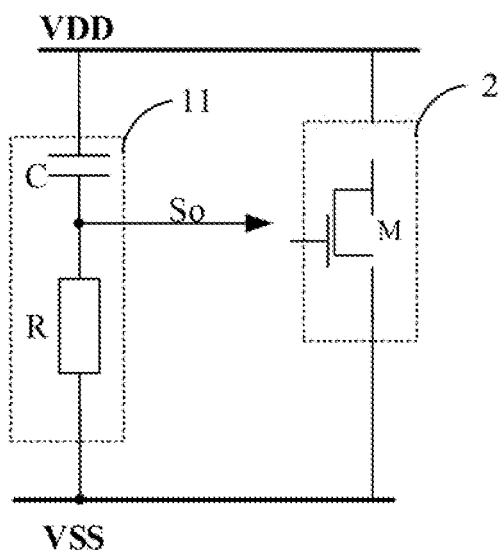
FIG. 2A and FIG. 2B are respectively schematic diagrams of a sub-detection circuit in two embodiments of the present disclosure.
Figure 2B:
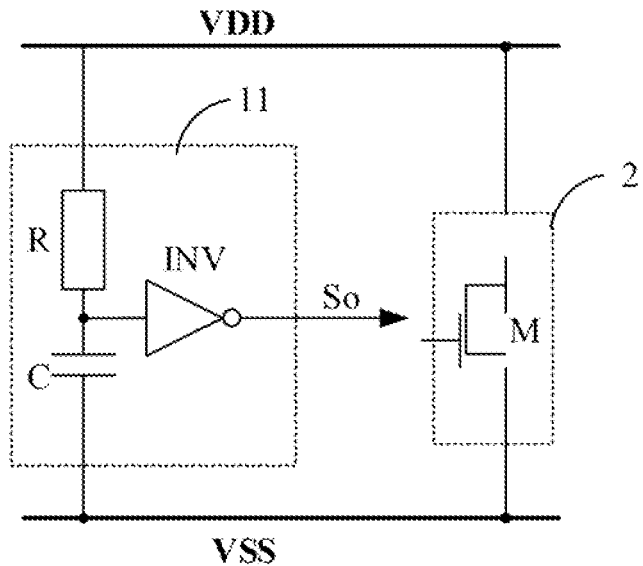

FIG. 2A and FIG. 2B are respectively schematic diagrams of a sub-detection circuit in two embodiments of the present disclosure.

Referring to FIG. 2A and FIG. 2B, in an exemplary embodiment of the present disclosure, the sub-detection circuit 11 is connected between the first power end VDD and the second power end VSS, and is configured to generate the sub-trigger signal So based on a voltage change between the first power end VDD and the second power end VSS. In the embodiments shown in FIG. 2A and FIG. 2B, the sub-detection circuit 11 includes a resistor R and a capacitor C.

In order to explain the working principle of the sub-detection circuit 11, in the embodiments shown in FIG. 2A and FIG. 2B, the electrostatic discharge circuit 2 includes an N-type transistor M. A drain of the N-type transistor M is connected to the first power end VDD, a source of the N-type transistor M is connected to the second power end VSS, and a gate of the N-type transistor M is used for receiving the sub-trigger signal So.

In FIG. 2A, one end of the resistor R is connected to a first electrode plate of the capacitor C, the other end of the resistor R is connected to the second power end VSS, a second electrode plate of the capacitor C is connected to the first power end VDD, and the sub-trigger signal So is outputted from the first electrode plate of the capacitor C, i.e. a connection point of the resistor R and the capacitor C. A connection mode of the resistor and the capacitor together with the N-type transistor M in the electrostatic discharge circuit 2 as shown in FIG. 2A jointly form a connection mode of Gate-Coupled NMOS (GCNMOS).

When there is no electrostatic pulse, the voltage of the second electrode plate of the capacitor C is equal to VDD, the first electrode plate of the capacitor C is grounded through the resistor R, the voltage of the first electrode plate is equal to VSS. The sub-trigger signal So is at a low level, and the N-type transistor M is turned off.

When the first power end VDD has an electrostatic pulse, the voltage of the first power end VDD rises. The voltage difference between two ends of the capacitor C is unchanged due to the coupling effect of the capacitor. The voltage of the second electrode plate of the capacitor C rises, therefore, the voltage of the first electrode plate of the capacitor C, namely the voltage at one end of the resistor R, rises, so that the first electrode plate of the capacitor C outputs the sub-trigger signal So at high level. Accordingly, the voltage difference Vgs between the gate and the source of the N-type transistor M increases and is greater than a turn-on threshold voltage Vth of the N-type transistor M, then the N-type transistor M is turned on to discharge electrostatic charges at the first power end VDD to the second power end VSS.

In FIG. 2B, one end of the resistor R is connected to the first power end VDD, and the other end of the resistor R is connected to a first electrode plate of the capacitor C. A second electrode plate of the capacitor C is connected to the second power end VSS. The first electrode plate of the capacitor C, i.e. the connection point of the resistor R and the capacitor C, is connected to an input end of an inverter INV. An output end of the inverter is used for outputting the sub-trigger signal So. The connection mode shown in FIG. 2B combined with the N-type transistor M is also known as a connection mode of a Gated Diode-merged NMOS (GDNMOS) with an inverter. Only one inverter INV is shown in FIG. 2B. In practical applications, an odd number (for example, 3) of inverters INV with inputs and outputs connected in series may be disposed, which is not specially limited by the present disclosure.

When there is no electrostatic pulse, the voltage of the first electrode plate of the capacitor C is equal to VDD, and the second electrode plate of the capacitor C is grounded (VSS). A gate voltage of a NMOS in the inverter INV is equal to VDD, the NMOS is turned on, and the inverter INV outputs a low level. That is, the sub-trigger signal So is at a low level, and the N-type transistor M is turned off.

When the first power end VDD has an electrostatic pulse, the second electrode plate of the capacitor C is grounded and its voltage remains unchanged, the voltage of the first electrode plate of the capacitor C remains at VDD due to the influence of the resistor R and the coupling effect of the capacitor, and the voltage at the input end of the inverter INV, namely the gate voltage of a PMOS in the inverter INV, is less than the source voltage of the PMOS. The source voltage and the gate voltage of the PMOS generate a voltage difference less than a threshold voltage Vth of the PMOS, then, the PMOS is turned on and the inverter INV outputs the sub-trigger signal So at a high level, so that the N-type transistor M is turned on to discharge the electrostatic charges of the VDD to the VSS.

Based on two cases in FIG. 2A and FIG. 2B, for the electrostatic pulse for the first power end VDD, the high-level pulse width of the sub-trigger signal So may be adjusted by adjusting the resistance value of the resistor R and the capacitance value of the capacitor C, and then the electrostatic discharge time of the electrostatic discharge circuit 2 may be adjusted. For example, in the connection mode shown in FIG. 2B, the RC time constant must be designed to be greater than 1 ms to trigger a clamp transistor, the clamp transistor (N-type transistor M) is kept in a turned-on state during the whole ESD event. In order to meet this standard, R is usually realized by a 50 kΩ N-well resistor, and C is realized by a 20 pF NMOS transistor polysilicon gate capacitor.

Although the resistor R and the capacitor C in the sub-detection circuit 11 in FIG. 2A and FIG. 2B are described based on one resistor and one capacitor, it is appreciated that in other embodiments of the present disclosure, the resistor R may be composed of multiple elements with resistance characteristics, for example, of multiple sub-resistors connected in parallel or in series. All the sub-resistors forming the resistor R may be adjustable resistors or realized by transistors. The capacitor C may also be composed of multiple elements with capacitive characteristics, for example, of multiple sub-capacitors connected in parallel. One or more sub-capacitors may be transistor gate capacitors (MOS-Cap), or a capacitor bank (Ni-Cap). The capacitor bank is realized by multiple capacitors sharing an upper electrode, which can reduce the total volume of multiple capacitors, thus reducing the layout area of the ESD circuit 100.

When the detection circuit 1 includes multiple sub-detection circuits 11, the resistance values of the resistors R in different sub-detection circuits 11 may be the same or different, and the capacitance values of the capacitors C in different sub-detection circuits 11 may be the same or different.

Figure 3A:
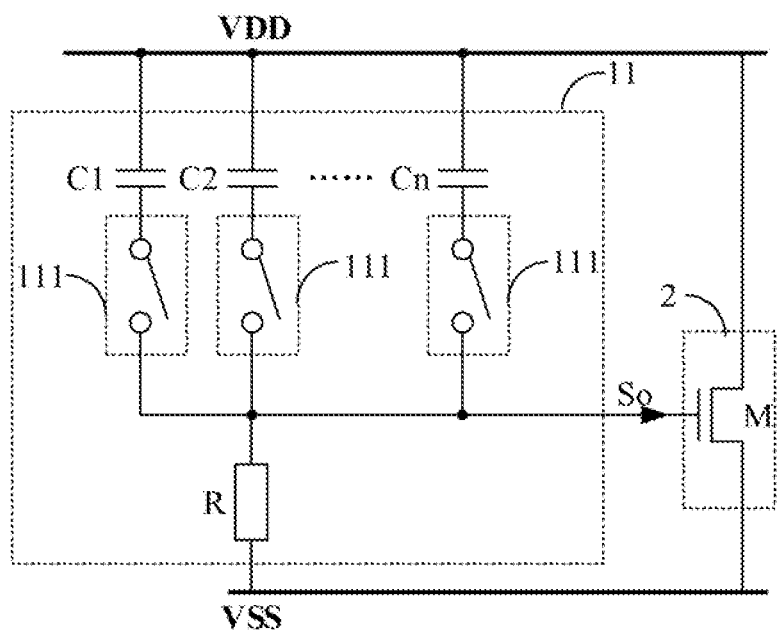
FIG. 3A and FIG. 3B are respectively schematic diagrams of a sub-detection circuit in other two embodiments of the present disclosure.
Figure 3B:
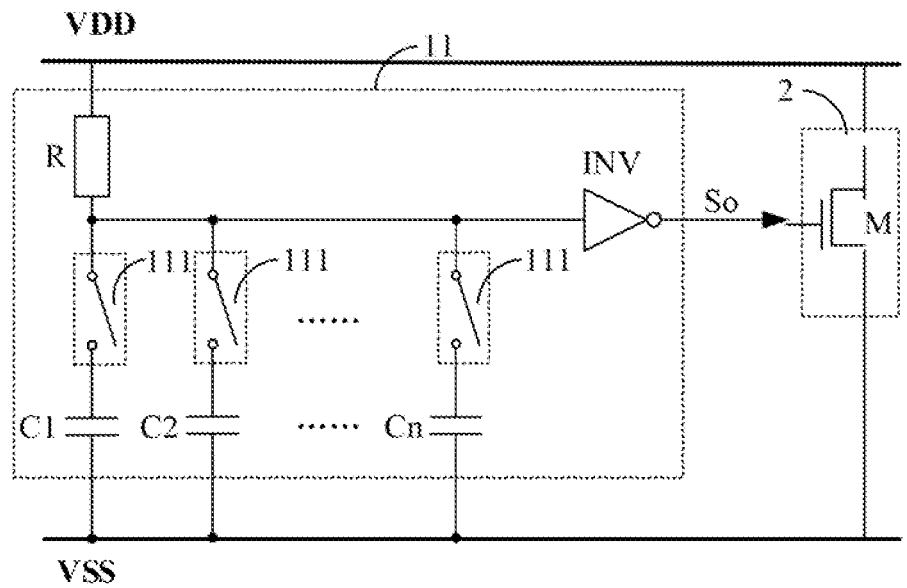

FIG. 3A and FIG. 3B are respectively schematic diagrams of a sub-detection circuit in other two embodiments of the present disclosure.

Referring to FIG. 3A and FIG. 3B, in an exemplary embodiment of the present disclosure, the sub-detection circuit 11 includes a resistor R and multiple capacitors C1 to Cn, where n is an integer greater than or equal to 1. There is a fourth selection circuit 111 disposed between each of the multiple capacitors C1 to Cn and the resistor R.

FIG. 3A corresponds to the connection mode of FIG. 2A, and FIG. 3B corresponds to the connection mode of FIG. 2B.

In an embodiment, the fourth selection circuit 111 is, for example, an E-fuse. The E-fuse is a necessary component of a disposable programmable memory. The magnitude of the capacitance value in the detection circuit 1 may be changed by blowing after the chip is manufactured, while ensuring that other functions are not affected. In the embodiment shown in FIG. 3A and FIG. 3B, it is assumed that n is equal to 3, the capacitance value of the capacitor C1 is A, and the ratio of capacitance values of the capacitors C1, C2 and C3 is 1:2:4, then a capacitance value of any value from A to 7 A may be obtained by controlling fourth selection circuits 111 connected to the capacitors C1, C2 and C3, so that the ESD circuit of the chip can be set flexibly.

Because only the capacitor is selected, compared with the embodiments shown in FIG. 2A and FIG. 2B, the embodiments shown in FIG. 3A and FIG. 3B can further reduce the layout area occupied by the resistor R while the parameters of the detection circuit 1 is kept adjustable.

With the sub-detection circuit 11 shown in FIG. 3A and FIG. 3B, the capacitance value of the capacitor C is adjustable, therefore the capacitance value of the capacitor in the detection circuit 1 can be adjusted.

In an embodiment of the present disclosure, in addition to adjusting the parameters inside the sub-detection circuit 11 to realize the adjustment of parameters of the detection circuit 1, the parameters of the detection circuit 1 may also be adjusted through the number of one or more sub-detection circuits 11 connected.

Figure 4:
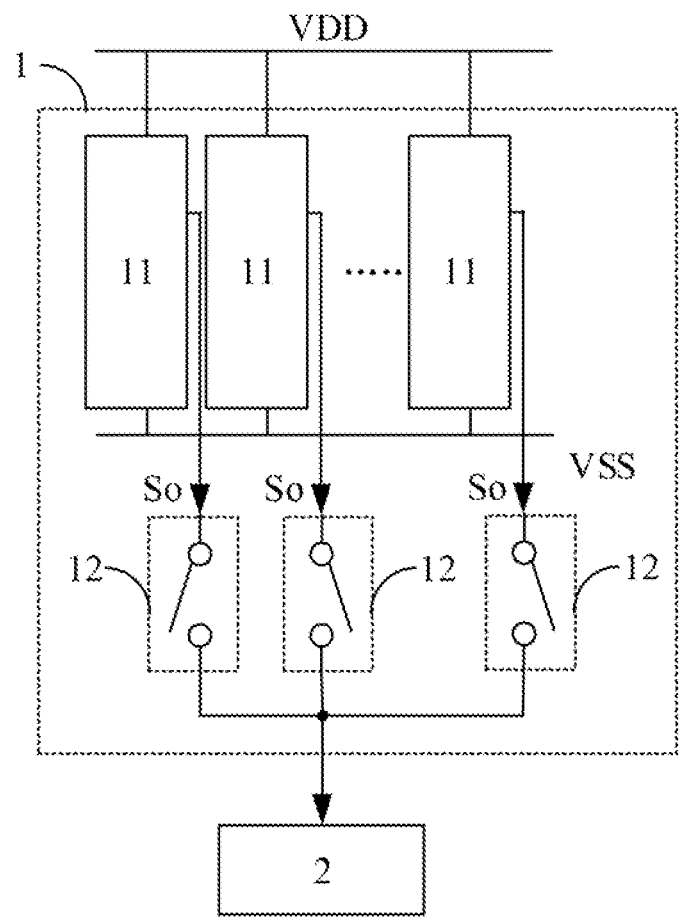
FIG. 4 is a schematic diagram of a detection circuit in an embodiment of the present disclosure.

FIG. 4 is a schematic diagram of a detection circuit in an embodiment of the present disclosure.

Referring to FIG. 4, when the same detection circuit 1 is shared, the parameter of the detection circuit 1 is difficult to be adjusted once to meet the requirement of any one of multiple electrostatic discharge circuits 2, and the cost of tape-out of the chip at the first time is high. Therefore, in an embodiment of the present disclosure, the parameter of the detection circuit 1 may be formed jointly by multiple sub-detection circuits 11.

In the embodiment shown in FIG. 4, when the detection circuit 1 includes multiple sub-detection circuits 11, each sub-detection circuit 11 in the detection circuit 1 and multiple electrostatic discharge circuits 2 may be connected or disconnected through a first selection circuit 12, each sub-detection circuit 11 outputs one sub-trigger signal So, and multiple electrostatic discharge circuits 2 may be controlled to be turned on through one or more sub-trigger signals So.

The first selection circuit 12 may be composed of an element with a switch function, such as a transistor or an E-fuse. By controlling the first selection circuits 12, one or more sub-detection circuits 11 can be selected to form the detection circuit 1 with proper parameters in practical applications. When multiple sub-detection circuits 11 are selected, the equivalent capacitance corresponding to the detection circuit 1 is the sum of capacitance values of the capacitors C of the multiple sub-detection circuits 11, and the equivalent resistance corresponding to the detection circuit 1 is the resistance value of the resistors R in parallel of multiple sub-detection circuits 11.

Although multiple sub-detection circuits 11 are disposed, the number of sub-detection circuits 11 is much smaller than that of electrostatic discharge circuits 2 due to the limited use scenarios of the detection circuit 1. Moreover, the function of the sub-detection circuits 11 is to jointly realize the parameters of a detection circuit 1, the resistor R and the capacitor C in each sub-detection circuit 11 are small, and the occupied layout area is much smaller than the total layout area occupied by the resistor R and the capacitor C to which each electrostatic discharge circuit 2 needs to be connected, so the setting of the sub-detection circuit 11 may allow the flexible adjustment of the parameters of the detection circuit 1 while reducing the layout area of the overall ESD circuit.

Figure 5:
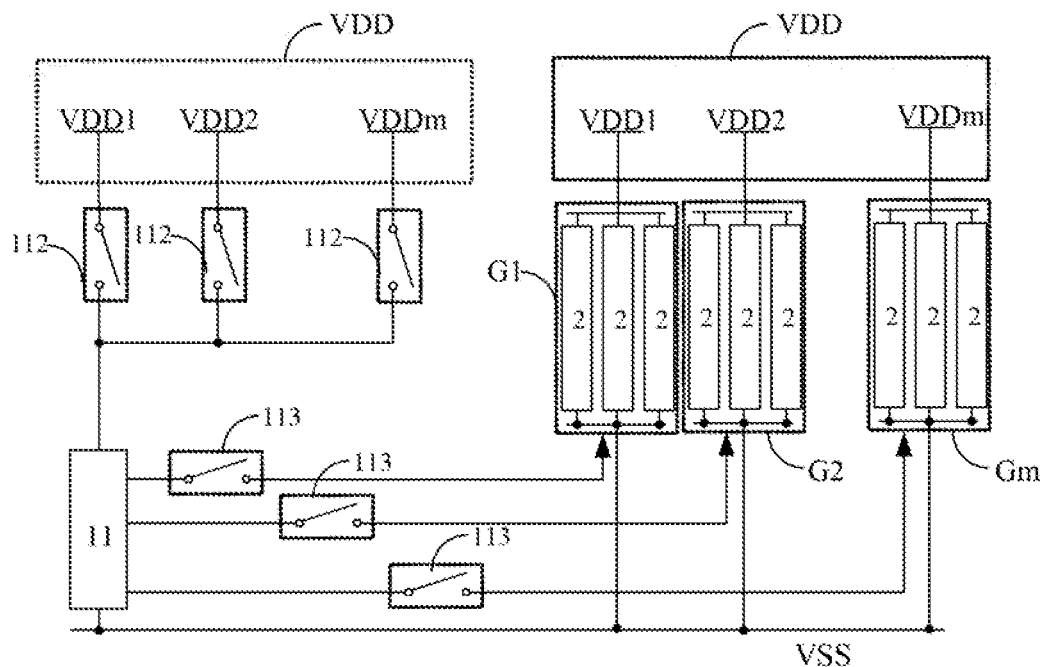
FIG. 5 is a schematic diagram of a sub-detection circuit in another embodiment of the present disclosure.

FIG. 5 is a schematic diagram of a sub-detection circuit in another embodiment of the present disclosure.

Referring to FIG. 5, in an exemplary embodiment of the present disclosure, the first power end VDD includes multiple sub-power ends VDD1 to VDDm, where m is a integer greater than 1. The voltages of the sub-power ends are different, and at least one electrostatic discharge circuit 2 is connected between each sub-power end and the second power end VSS. In the embodiment shown in FIG. 5, it is assumed that there is one electrostatic discharge circuit group Gi connected between a sub-power end VDDi and the second power end VSS, and the electrostatic discharge circuit group Gi includes multiple electrostatic discharge circuits 2 (for example, 3 in FIG. 5), where i is a serial number of the sub-power end, $1 \leq i \leq m$.

Each sub-detection circuit 11 and each of the sub-power ends VDD1 to VDDm are connected or disconnected through a second selection circuit 112. Each sub-detection circuit 11 and one or more electrostatic discharge circuits (i.e., the electrostatic discharge circuit group Gi) corresponding to a respective sub-power end VDDi are connected or disconnected through a third selection circuit 113.

By controlling both the second selection circuit 112 and the third selection circuit 113 for a same sub-power end to be turned on or turned off, a sub-detection circuit 11 can be controlled to perform electrostatic detection to which sub-power end.

The sub-detection circuit 11 shown in FIG. 5 may be the structure shown in any of embodiments of FIG. 2A, FIG. 2B, FIG. 3A, and FIG. 3B.

Figure 6:
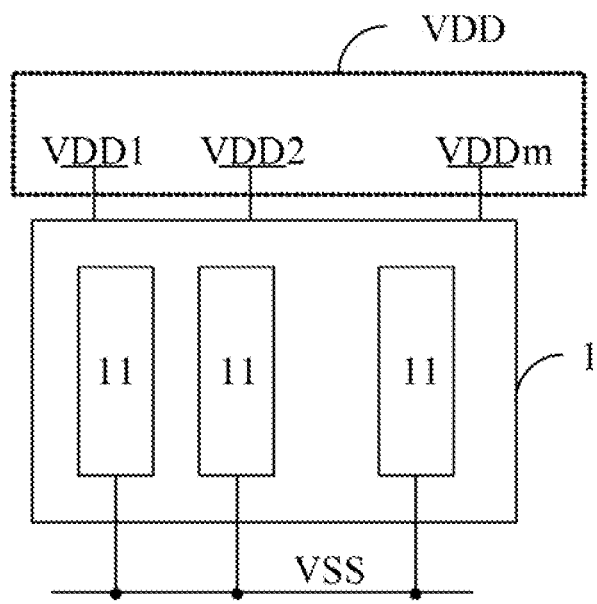
FIG. 6 is a schematic diagram of a detection circuit in another embodiment of the present disclosure.

FIG. 6 is a schematic diagram of a detection circuit in another embodiment of the present disclosure.

Referring to FIG. 6, when the sub-detection circuit 11 is shown in FIG. 5, the detection circuit 1 may include multiple sub-detection circuits 11. When the first power end VDD includes multiple sub-power ends VDD1 to VDDm, any number of sub-detection circuits 11 in the detection circuit 1 may be selected to be connected to a sub-power end VDDi. In an embodiment, at least one sub-power end VDDi is connected to multiple sub-detection circuits 11.

It is to be noted that a sub-detection circuit 11 can only be connected to a sub-power end VDDi and the electrostatic discharge circuit group Gi corresponding to the sub-power end VDDi.

The resistance parameters and capacitance parameters in different sub-detection circuits 11 may be the same or different. When a variety of power voltages are set for a large chip, the ESD parameters for multiple power voltages can be flexibly adjusted by flexibly selecting the sub-detection circuit 11 connected to each sub-power end, thereby saving the area of the chip and avoiding re-spins.

Figure 7:
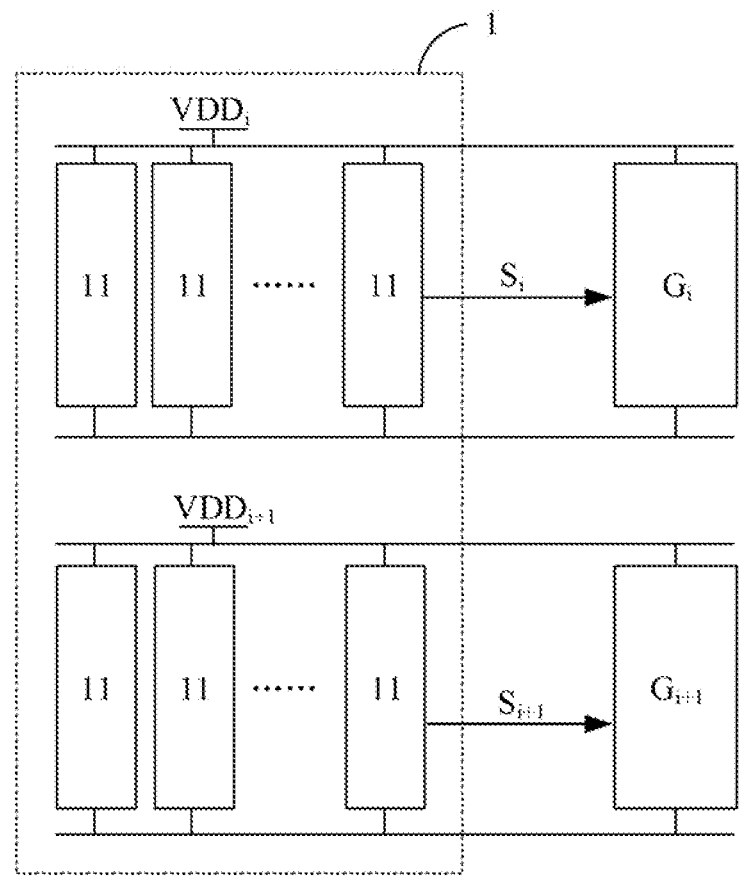
FIG. 7 is a schematic diagram of a trigger signal shown in FIG. 6 according to an embodiment of the present disclosure.

FIG. 7 is a schematic diagram of a trigger signal shown in FIG. 6 according to an embodiment of the present disclosure.

Referring to FIG. 7, in the embodiment of FIG. 6, the detection circuit 1 includes multiple sub-detection circuits 11, and the first power end VDD includes multiple sub-power ends VDD1 to VDDm. In this case, the sub-trigger signals So outputted by one or more sub-detection circuits 11 may form a grouped trigger signal Si, and the grouped trigger signal Si corresponds to the electrostatic discharge circuit group Gi connected to one sub-power end VDDi, where i is the serial number of the sub-power end.

By making the electrostatic discharge circuits 2 with different power voltages share a detection circuit 1, the ESD parameters corresponding to different power voltages may be flexibly set, thus effectively reducing the volume of a complex chip using a variety of power voltages.

Figure 8:
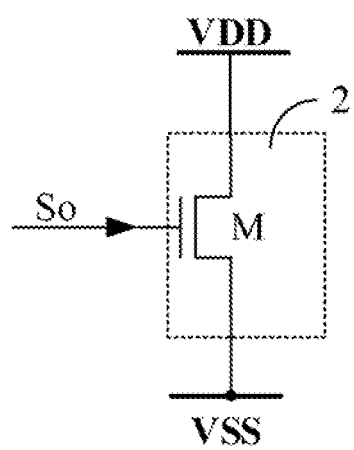
FIG. 8 is a schematic diagram of an electrostatic discharge circuit in an embodiment of the present disclosure.

FIG. 8 is a schematic diagram of an electrostatic discharge circuit in an embodiment of the present disclosure.

Referring to FIG. 8, in an embodiment, the electrostatic discharge circuit 2 may include a discharge transistor M. The first end of the discharge transistor M is connected to the first power end VDD, the second end of the discharge transistor M is connected to the second power end VSS, and the control end of the discharge transistor M receives the sub-trigger signal So. The discharge transistor M may be an N-type transistor. In some embodiments, the P-type substrate of the discharge transistor M is connected to a second voltage source VSS.

The electrostatic discharge circuit 2 shown in FIG. 8 may be used for any above embodiment. In other embodiments of the present disclosure, the electrostatic discharge circuit 2 may also have other structures. Those skilled in the art may set the structure of the electrostatic discharge circuit 2 by themselves according to the actual situation, and there is no special restriction in the present disclosure.

According to a second aspect of the present disclosure, a memory is provided, which may include the above ESD circuit.

It is to be noted that, although a plurality of modules or units of the device for action execution are mentioned in the foregoing detailed descriptions, but this division is not mandatory. Actually, according to the implementations of the present disclosure, the foregoing described features and functions of two or more modules or units may be embodied in a module or unit. On the contrary, the foregoing described features and functions of a module or unit may further be embodied by a plurality of modules or units.

Other implementation solutions of the present disclosure will be apparent to those skilled in the art from consideration of the specification and practice of the present disclosure. This present disclosure is intended to cover any variations, uses, or adaptations of the present disclosure following the general principles thereof and including such departures from the present disclosure as come within known or customary practice in the art. The specification and embodiments are considered as exemplary only, and the true scope and concept of the present disclosure are indicated by the claims.

INDUSTRIAL APPLICABILITY

By setting multiple electrostatic discharge circuits to share one detection circuit, the use of capacitors and resistors can be greatly reduced in the ESD circuit provided by the embodiments of the present disclosure, thus reducing the layout area of the ESD circuit and reducing the size of chip.

What is claimed is:

1. An Electro Static Discharge (ESD) circuit, comprising:
    a detection circuit, which comprises at least one sub-detection circuit connected between a first power end and a second power end, each sub-detection circuit is configured to generate a sub-trigger signal based on a voltage change between the first power end and the second power end; and
    multiple electrostatic discharge circuits, which are connected between the first power end and the second power end, the multiple electrostatic discharge circuits are configured to be turned on according to one or more sub-trigger signals;
    wherein the first power end comprises multiple sub-power ends, at least one electrostatic discharge circuit is connected between each sub-power end and the second power end, each sub-detection circuit and each sub-power end are connected or disconnected through a first selection circuit, each sub-detection circuit and an electrostatic discharge circuit corresponding to each sub-power end are connected or disconnected through a second selection circuit, one sub-detection circuit is connected to only one sub-power end through the first selection circuit and the one sub-detection circuit is connected to an electrostatic discharge circuit corresponding to the one sub-power end through the second selection circuit.

2. The ESD circuit of claim 1, wherein the detection circuit comprises multiple sub-detection circuits, and at least one sub-power end is connected to the multiple sub-detection circuits.

3. The ESD circuit of claim 2, wherein one or more sub-trigger signals output by one or more sub-detection circuits connected to one sub-power end jointly form a grouped trigger signal corresponding to the sub-power end, the grouped trigger signal controls an electrostatic discharge circuit connected to the sub-power end.

4. The ESD circuit of claim 1, wherein each sub-detection circuit comprises a resistor and a capacitor.

5. The ESD circuit of claim 4, wherein one end of the resistor is coupled to a first electrode plate of the capacitor, and the other end of the resistor is coupled to the second power end, a second electrode plate of the capacitor is coupled to the first power end, and the first electrode plate of the capacitor outputs a sub-trigger signal.

6. The ESD circuit of claim 5, wherein the sub-detection circuit comprises multiple capacitors, and first electrode plates of the multiple capacitors are coupled to one end of the resistor respectively through multiple fourth selection circuits.

7. The ESD circuit of claim 6, wherein the fourth selection circuit comprises an E-fuse.

8. The ESD circuit of claim 4, wherein each sub-detection circuit comprises a resistor, a capacitor and an inverter; one end of the resistor is coupled to the first power end, and the other end of the resistor is coupled to a first electrode plate of the capacitor, a second electrode plate of the capacitor is grounded, the first electrode plate of the capacitor is coupled to an input end of the inverter, and an output end of the inverter is used for outputting a sub-trigger signal.

9. The ESD circuit of claim 4, wherein the number of sub-detection circuits is multiple, and wherein resistance values of resistors in different sub-detection circuits are different; or
capacitance values of capacitors in different sub-detection circuits are different; or
resistance values of resistors in different sub-detection circuits are different and capacitance values of capacitors in different sub-detection circuits are different.

10. The ESD circuit of claim 4, wherein the capacitor is a capacitor bank.

11. The ESD circuit of claim 1, wherein the electrostatic discharge circuit comprises a discharge transistor, a first end of the discharge transistor is connected to the first power end, a second end of the discharge transistor is connected to the second power end, and a control end of the discharge transistor is used for receiving a trigger signal.

12. A memory, comprising an Electro Static Discharge (ESD) circuit, the ESD circuit comprising:
a detection circuit, which comprises at least one sub-detection circuit connected between a first power end and a second power end, each sub-detection circuit is configured to generate a sub-trigger signal based on a voltage change between the first power end and the second power end; and
multiple electrostatic discharge circuits, which are connected between the first power end and the second power end, the multiple electrostatic discharge circuits are configured to be turned on according to one or more sub-trigger signals;
wherein the first power end comprises multiple sub-power ends, at least one electrostatic discharge circuit is connected between each sub-power end and the second power end, each sub-detection circuit and each sub-power end are connected or disconnected through a first selection circuit, each sub-detection circuit and an electrostatic discharge circuit corresponding to each sub-power end are connected or disconnected through a second selection circuit, one sub-detection circuit is connected to only one sub-power end through the first selection circuit and the one sub-detection circuit is connected to an electrostatic discharge circuit corresponding to the one sub-power end through the second selection circuit.

13. The memory of claim 12, wherein the detection circuit comprises multiple sub-detection circuits, and at least one sub-power end is connected to the multiple sub-detection circuits.

14. The memory of claim 13, wherein one or more sub-trigger signals output by one or more sub-detection circuits connected to one sub-power end jointly form a grouped trigger signal corresponding to the sub-power end, the grouped trigger signal controls an electrostatic discharge circuit connected to the sub-power end.

* * * * *